United States Patent [19]

Hanabe et al.

[11] Patent Number: 6,074,476

[45] Date of Patent: Jun. 13, 2000

[54] NON-CONTACT PROCESSING OF CRYSTAL MATERIALS

[75] Inventors: Murali Hanabe; Nainesh J. Patel; Evangellos Vekris, all of Plano, Tex.

[73] Assignee: Ball Semiconductor, Inc., Allen, Tex.

[21] Appl. No.: 09/209,653

[22] Filed: Dec. 10, 1998

Related U.S. Application Data

[60] Provisional application No. 60/092,376, Jul. 10, 1998.

[51] Int. Cl.[7] .............................. C30B 9/00; C30B 29/00
[52] U.S. Cl. ............................. 117/11; 117/54; 117/73; 117/206; 117/902; 23/295 R
[58] Field of Search ................................ 117/11, 54, 73, 117/206, 902; 23/295 R

[56] References Cited

U.S. PATENT DOCUMENTS

| 4,389,904 | 6/1983 | Lacy et al. ........................ 73/863.11 |
| 4,430,150 | 2/1984 | Levine et al. ........................... 117/73 |
| 4,812,166 | 3/1989 | Saiki et al. ............................. 75/346 |

FOREIGN PATENT DOCUMENTS

| 7-118099 | 5/1995 | Japan . |
| 8-133899 | 5/1996 | Japan . |

OTHER PUBLICATIONS

Appl. No. 08/858,004, filed May 16, 1997, now U.S. patent 5,955,776.

Appl. No. 09/033,180, filed Mar. 2, 1998, Murzin, et al. Inductively Coupled Plasma Powder Vaporization for Fabricating Integrated Circuits, allowed Dec. 15, 1999, patent pending.

Nakata et al., "Gravity–Dependent Silicon Crystal Growth Using a Laser Heating Systems", Jap. Journal of Applied Physics, vol. 33 (1994): 1202–1204.

*Primary Examiner*—Benjamin L. Utech
*Assistant Examiner*—Donald L. Champagne
*Attorney, Agent, or Firm*—Haynes & Boone, L.L.P.

[57] ABSTRACT

A system and method for forming spherical semiconductor crystals is disclosed. The system includes a receiver tube 18 for receiving semiconductor granules 104. The granules are then directed to a chamber 14 defined within an enclosure 20. The chamber maintains a heated, inert atmosphere with which to melt the semiconductor granules into a molten mass. A nozzle, 40, creates droplets from the molten mass, which then drop through a long drop tube 16. As the droplets move through the drop tube, they form spherical shaped semiconductor crystals 112. The drop tube is heated and the spherical shaped semiconductor crystals may be single crystals. An inductively coupled plasma torch positioned between the nozzle and the drop tube melts the droplets, but leaving a seed in-situ. The seed can thereby facilitate crystallization.

31 Claims, 6 Drawing Sheets

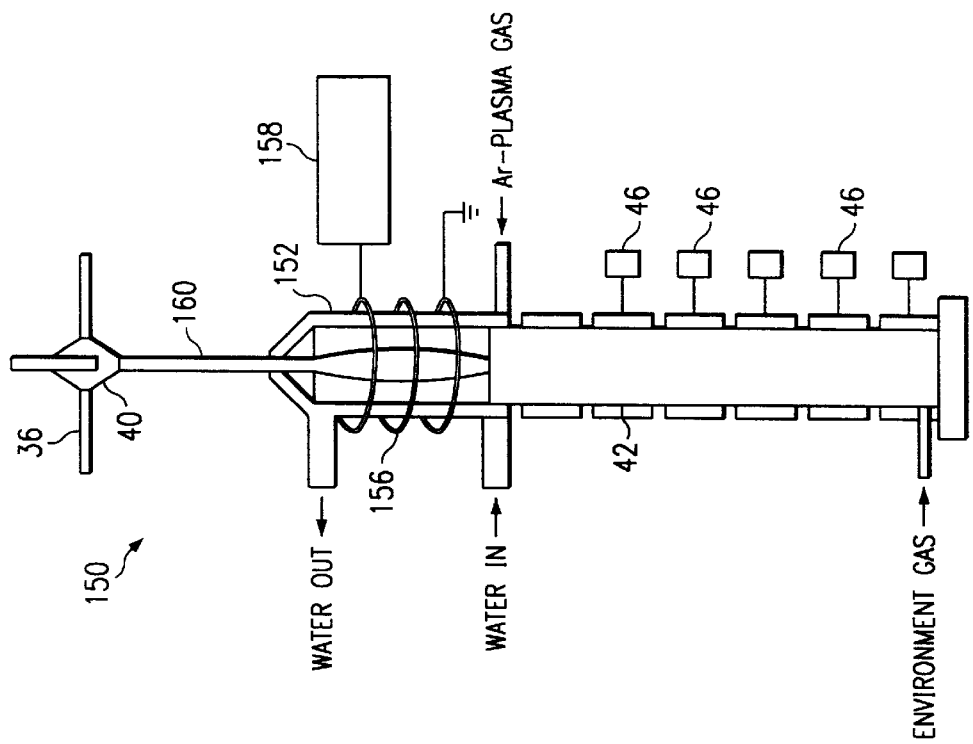
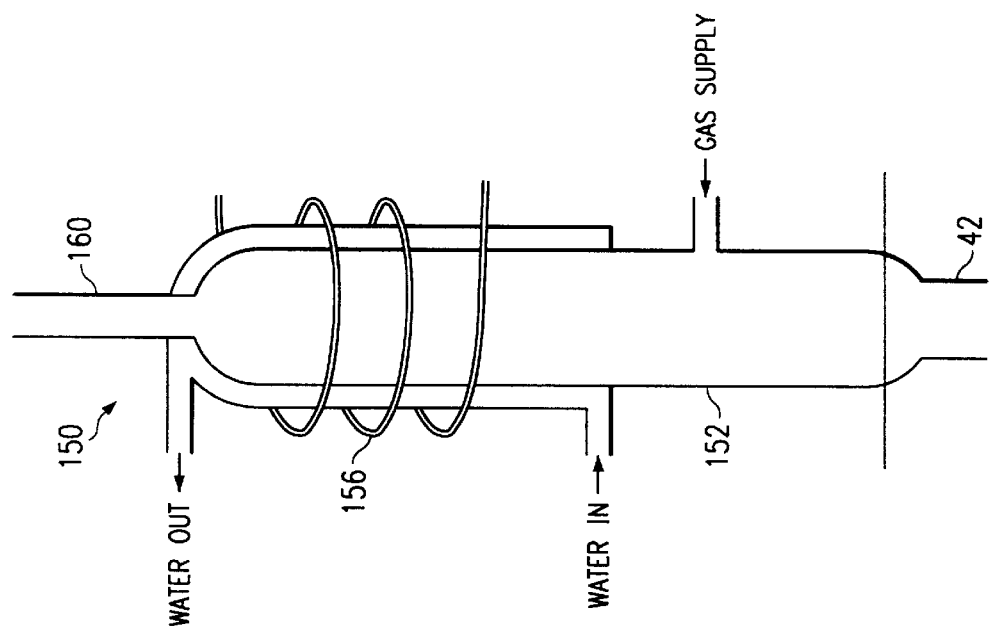

NON-CONTACT PROCESSING OF CRYSTAL MATERIALS

CROSS REFERENCE

This disclosure claims the benefit of provisional patent application U.S. Ser. No. 60/092,376 filed Jul. 10, 1998 and entitled Formation of Spherical Crystals by Liquid Dropper.

BACKGROUND OF THE INVENTION

The invention relates generally to semiconductor devices, and more particularly, to an apparatus and method for forming a device such as a spherical-shaped semiconductor crystal.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

Manufacturing the wafers requires creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above process typically have many defects. These defects can be attributed to the difficulty in making a single, highly pure crystal due to the cutting, grinding and cleaning processes as well as impurities associated with containers used in forming the crystals. These defects become more and more prevalent as the integrated circuits formed on these wafers contain smaller and smaller dimensions.

In co-pending U.S. patent application Ser. No. 08/858,004 filed on May 16, 1997, a method and apparatus for manufacturing spherical-shaped semiconductor integrated circuit devices is disclosed. Although certain manufacturing methods for making spherical shaped crystals are disclosed in the above-referenced application, an improved method of making the spherical shaped crystals, which includes fewer defects and is more manufacturable, is desired.

SUMMARY OF THE INVENTION

The present invention, accordingly, provides an apparatus and method for processing crystals. To this end, one embodiment provides a receiver tube for receiving semiconductor granules. The granules are then directed to a chamber defined within an enclosure. The chamber maintains a heated, inert atmosphere with which to melt the semiconductor granules into a molten mass. A nozzle, located at one end of the chamber, creates droplets from the molten mass, which then drop through a long drop tube. As the droplets move through the drop tube, they form the spherical shaped semiconductor crystals.

In another embodiment, the drop tube is heated with an inductively coupled plasma torch located between the nozzle and the drop tube. The plasma torch melts the droplets, thereby decreasing the number of crystalline directions in the droplet.

In yet another embodiment, spherical shaped crystals are formed from polycrystal granules. The polycrystal granules are melted into a seed and a molten mass. The molten mass then solidifies around the in-situ seed. As a result, the molten mass creates a crystal with crystalline directions identical to those of the seed.

In still another embodiment, before the polycrystal granules are formed into the spherical shaped crystals, they are coated with a nucleating agent. Once coated, the granules are completely melted and then re-solidified. By so doing, the resulting polycrystal granules have fewer crystalline directions, which promotes the ability to form a single crystal seed.

In different embodiments, different structures may be utilized, some of which may not come into physical contact with any of the polycrystal granules, droplets, or other material.

BRIEF DESCRIPTION OF THE DRAWINGS

FIGS. 3, 3a and 3b illustrate a plasma torch for use with the processor of FIG. 1.

DESCRIPTION OF THE PREFERRED EMBODIMENT

Figure 1:
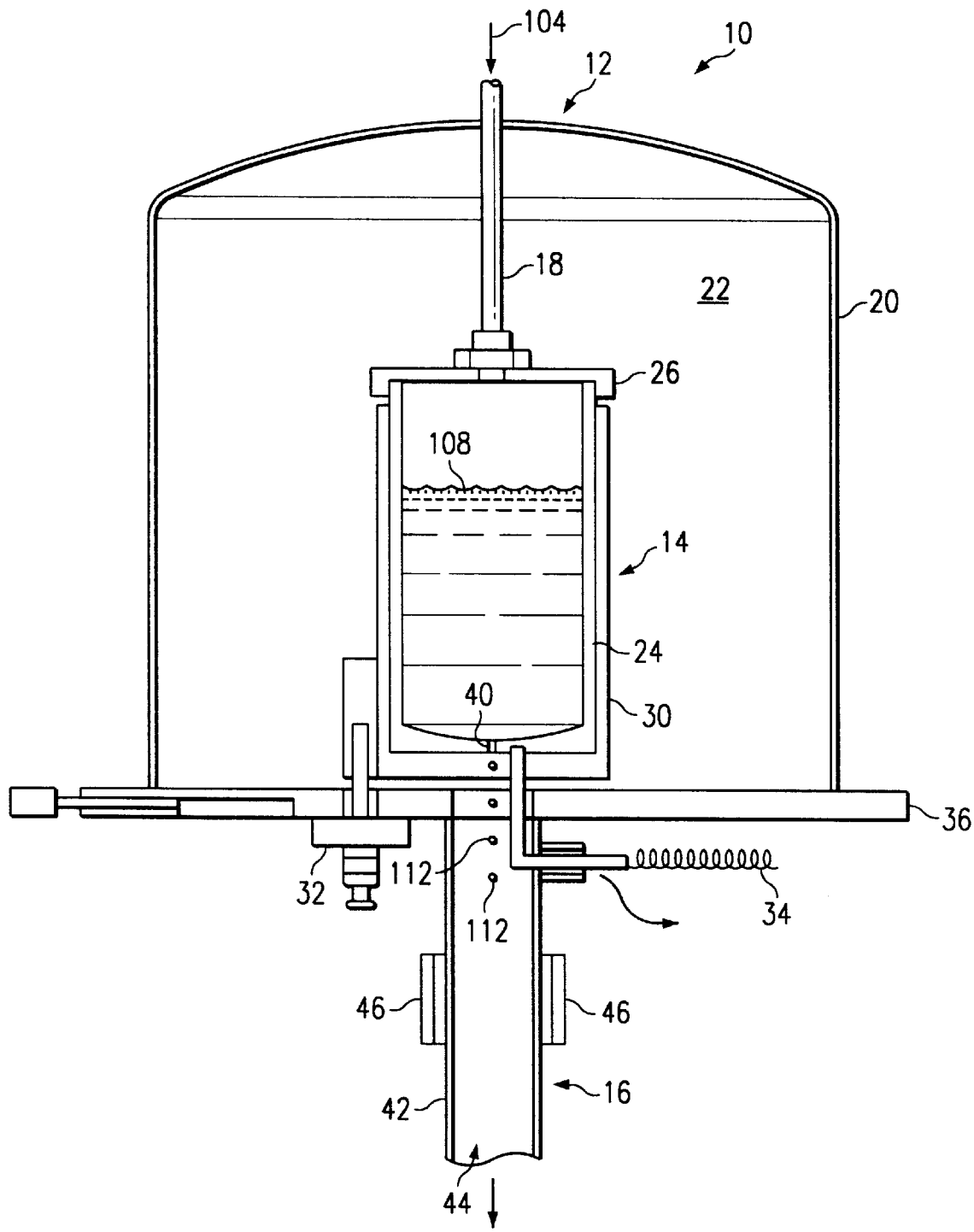
FIG. 1 illustrates a side, cut-away view of a processor according to one embodiment of the invention.

Referring to FIG. 1, the reference numeral 10 designates, in general, one embodiment of a processor for forming spherical shaped semiconductor crystals and/or solar cell crystals. Formation of the crystals may be facilitated in different manners by varying parameters described herein, including repetitive processing through portions of the processor 10.

The processor 10 can be separated into three sections: an input section 12, a main furnace section 14, and a dropper section 16. The input section 12 includes a receiver tube 18 for receiving processing materials, such as granules, gases and the like. The receiver tube 18 is about 2 centimeters in diameter and registers with the main furnace section 14

An enclosure 20 surrounds the main furnace section 14 and supports a general environment for processing. The enclosure is filled with an insulative material 22 to contain the relatively high temperatures produced in the main furnace section. The enclosure 20 and insulative material 22 provide an inert atmosphere, which prevents burnout of the insulation material 22 and other components stored therein. Disposed within the insulative material is a crucible 24. The crucible serves to hold molten semiconductor material, yet not react with the material.

A lid 26 of the crucible 24 connects to the receiver tube 18. In the present embodiment, the lid is threadably engaged to the receiver tube to facilitate removal and separation of the various components. The lid 26 further maintains the inert atmosphere inside the enclosure. Alternative embodiments may have other types of lids that either temporarily or permanently secure the receiver tube 18 to the crucible 24. The receiver tube 18 can either batch feed or continuously feed raw semiconductor material from the crucible 24. For each type of feeding, a different lid 26 may be required.

Immediately surrounding the outside of the crucible 24 is a furnace 30. In the present embodiment, the furnace is a fluid-heat type furnace, although other sources of heat may be used. The furnace 30 includes a fluid nozzle 32 through which the fluid may pass. The fluid nozzle 32 further maintains the inert atmosphere inside the enclosure 20. Although not shown, another device may be used to heat the fluid before it passes through the fluid nozzle 32. Also, a heat measurement device 34, such as a thermocouple, is attached to the furnace 30 for monitoring the temperature of the furnace 30 and of the crucible 24.

The enclosure 20, along with the crucible 24, rests on a support platform 36. The platform has several apertures to facilitate the various devices and processes herein disclosed. The platform 36 is also able to withstand some of the severe heat that radiates from the furnace 30 while maintaining the inert atmosphere inside the enclosure 20.

Attached to a bottom portion of the crucible 24, as seen in FIG. 1, is a dropper 40. Although not shown, the dropper 40 may include a nozzle that injects precise sized droplets of molten semiconductor material from the crucible 24 and into the dropper section 16. In one embodiment, the nozzle may be according to U.S. Pat. No. 5,560,543, entitled Heat-resistant Broad-bandwidth Liquid Droplet Generators. Alternatively, or in combination with the nozzle, inert gas may also be applied to facilitate the precise amounts of molten semiconductor material being injected into the dropper section 16.

The dropper section 16 includes a long drop tube 42. For example, the drop tube 42 may be stainless steel with an electro-polished inside finish, about five to ten centimeters in diameter and about ten meters in length. The drop tube 42 includes apertures so that a cooling gas 44 may flow therein. The cooling gas may also include impurities for doping the semiconductor material to a desired level. In some embodiments, a heater 46 is placed adjacent to the drop tube 42. The heater 46 helps to reduce the number of different crystalline growth directions by slowing the cooling process.

Figure 2:
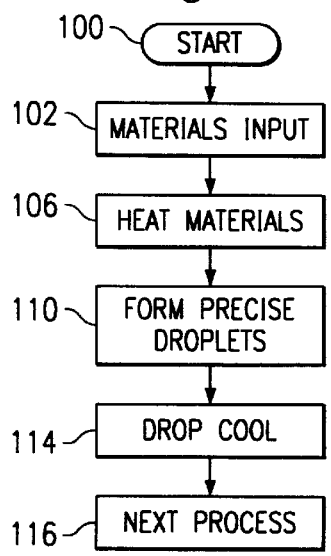
FIG. 2 is a flow chart of a method for making crystal spherical devices using the processor of FIG. 1.
Figure 4A:
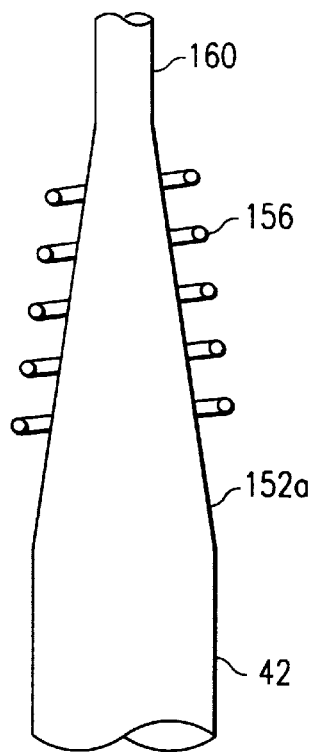
FIGS. 4a, 4b, 4c and 4d are examples of different shaped quartz tubes for use with the plasma torch of FIG. 3.
Figure 4B:
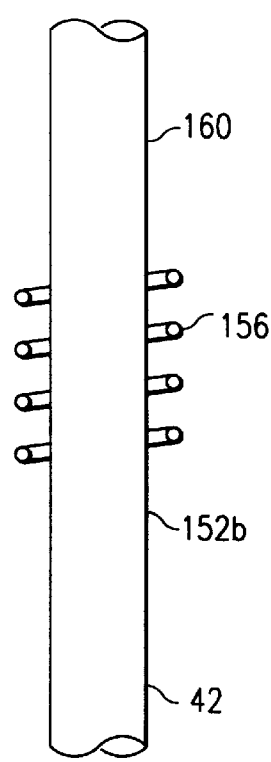
Figure 4C:
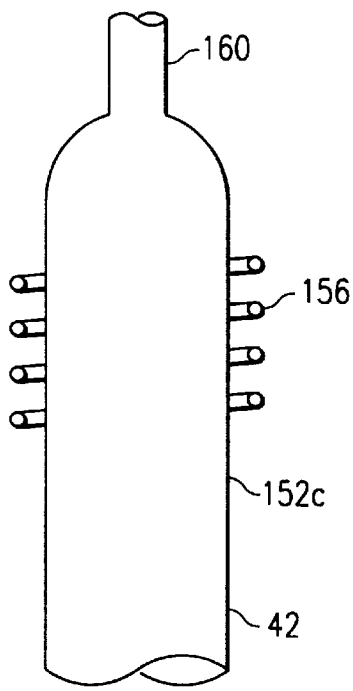
Figure 4D:
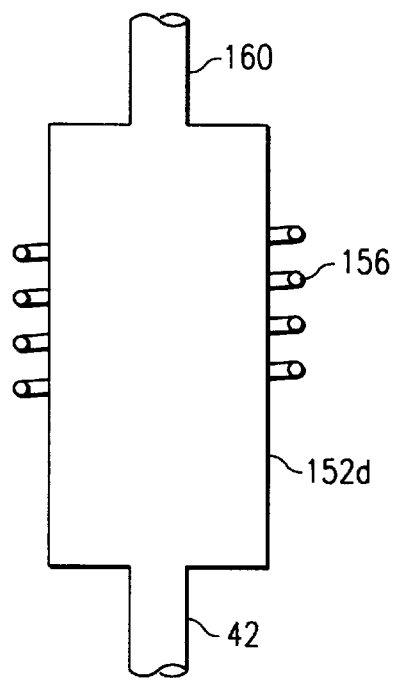

Referring to FIG. 2, a method 100 may be used in conjunction with the processor 10. At step 102, material 104 is placed into the receiver tube 18. For the sake of example, the material includes silicon, it being understood that different types of semiconductor material may also be used. The material 104 may also include an inert carrier gas, such as argon, and one or more dopant materials.

At step 106, the material 104 passes through the lid 26 and into the main furnace section 14. The furnace 30 can produce temperatures of about 1600° C., which far exceed the melting point of silicon (1410° C.). This high temperature causes the material 104 to become a molten mass 108. At step 110, the nozzle 40 allows droplets 112 of the molten mass to leave the crucible 24 and enter the dropper section 16. At step 114, the droplets 112 fall down the drop tube 42. The drop tube will allow the droplets to cool and form a polycrystalline structure. The cooling gases 44 may be, for example, helium, hydrogen, argon, or nitrogen to facilitate the cooling of the droplets. The cooling gases 44 may also be used to control the rate of descent of the droplets 112.

In some embodiments, the processor 10 controls the rate at which the droplets 112 cool. This may occur by many different methods. For example, the cooling gases 44 may be heated. Also, the drop tube 42 may be heated by the heaters 46. As a result, the droplets 112 will cool very slowly, thereby forming crystals. In additional embodiments, such as those discussed with reference to FIG. 3 below, the heaters 46 may actually melt the droplets. At step 114, the cooled droplets are then transferred to a next operation for processing.

Figure 3:
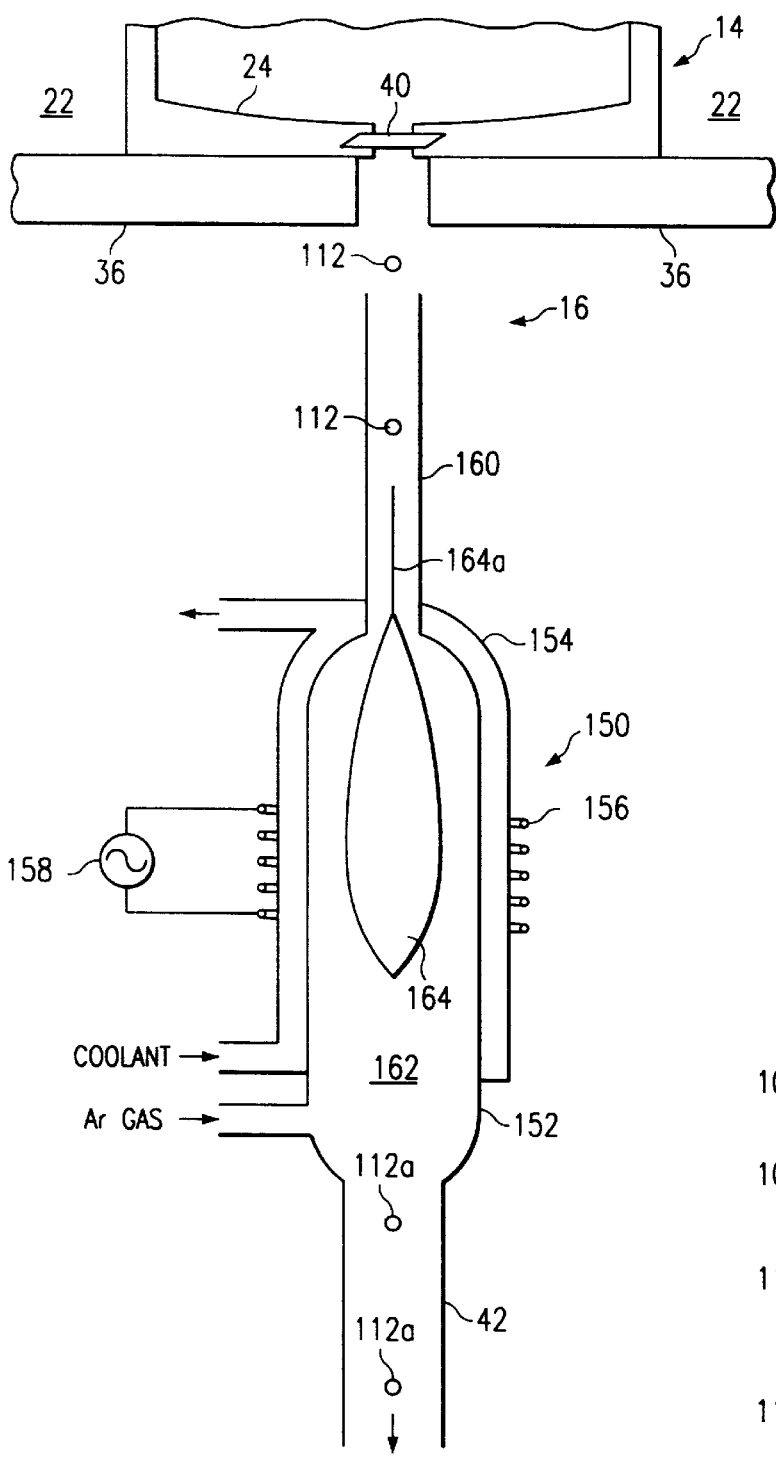

Referring to FIGS. 3, 3a, and 3b, in another embodiment, an inductively coupled plasma ("ICP") torch 150 is positioned above the drop tube 42. The ICP torch 150 includes a quartz tube 152 made of a high temperature material, for example, ceramic. Surrounding the quartz tube 152 is a cooling system 154. The cooling system may include water or any other type of coolant to help prevent the quartz tube 152 from melting.

Also surrounding the quartz tube 152 is a conductive coil 156. In the present embodiment, the conductive coil 156 is a hollow copper coil attached to a radio frequency ("RF") energy generator 158. Because the coil 156 is hollow, air or other fluid can flow therethrough to help lower the temperature of the coil.

An entry tube 160 is attached to the quartz tube 152 for receiving the droplets 112 (FIG. 1) and directing them towards a central chamber 162 of the quartz tube. Although not shown, a shield may be provided to prevent radiation losses from plasma in the tube 160.

In operation, an argon gas flows at atmospheric pressure inside the quartz tube 152. The RF generator 158 operates at a desired frequency to heat the gas, thereby creating a plasma flame 164. The plasma flame 164 is at a temperature between 8000° K. to 10,000° K., which depends on the gas flow rate and torch dimensions. A portion of the flame 164a extends into the entry tube 160 and serves as a preheater.

When a droplet 112 enters the entry tube 160, it is quickly preheated by the plasma flame 164a. The droplet 112 then enters the central chamber 162 where the plasma flame 164 melts it. Because the temperature of the flame 164 is so high, impurities in the droplet 112 will vaporize. As the droplets exit the central chamber 162, they solidify to form crystals 112a. The crystals 112a advance through the drop tube 42 where they cool, as described above with reference to FIGS. 1 and 2.

In many instances, the crystals 112a are single crystal granules with a consistent, uniform crystalline direction. However, in other instances, the crystals 112a may be polycrystal granules with multiple crystalline directions. It is understood, however, that the polycrystals produced by the drop tube 42 will have fewer different crystalline directions than the droplets 112, i.e., there are fewer crystalline structures in a single granule.

Referring to FIGS. 4a–4d, the quartz tube 152 can take on various shapes and sizes that will affect both the plasma flame 164 as well as the portion 164a. Therefore, it is anticipated that different quartz tubes, such as quartz tubes 152a–d, can be utilized to accommodate different requirements of the heater 46.

Figure 5:
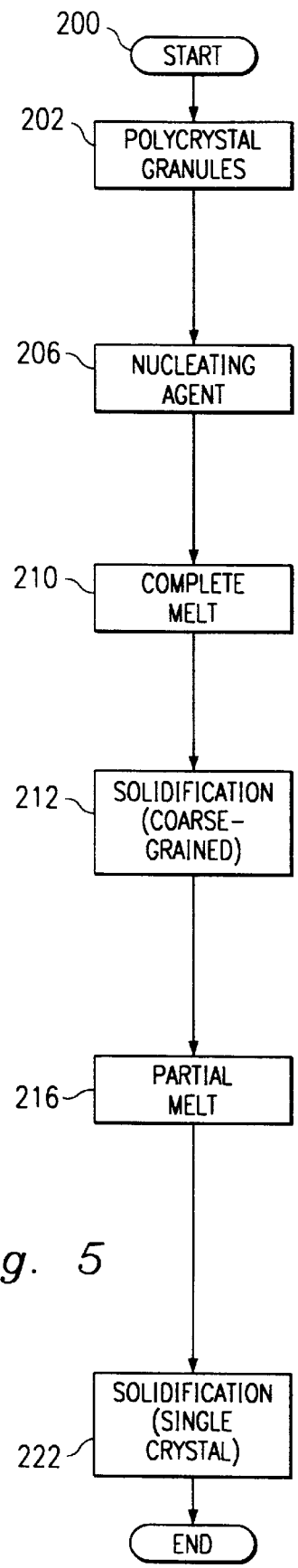
FIG. 5 is a flow chart of a method for making single crystal spherical devices.

Referring to FIG. 5, to facilitate the formation of single crystalline material with the above described devices and methods, an in-situ seeding process 200 may be used. Forming single crystalline materials by non-contact processing is difficult because the solidification of the material may not be unidirectional, and hence polycrystal. Uniform crystalline direction is facilitated using a seed or a crystal nucleating agent. The in-situ seeding process 200 may utilize a non-contact processing technique in which a seed is introduced in-situ into the material by controlling the melting of the feed material.

FIGS. 6a–6f provide illustrations and examples of intermediate material configurations for each step of the in-situ seeding process 200. Furthermore, exemplary processing details are provided with FIGS. 6a–6f. It is understood, however, that the illustrations and examples of FIGS. 6a–6f are only provided for the sake of clarity and are not intended to limit the invention in any way.

At step 202 of FIG. 5, a first step in the formation of single crystal silicon spheres is to obtain a polycrystalline granule.

Figure 6A:
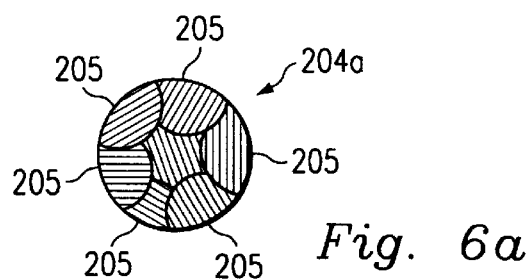
FIGS. 6a, 6b, 6c, 6d, 6e and 6f are illustrations of different stages of a single crystal spherical device produced according to the method of FIG. 5.

Referring also to FIG. 6a, an illustration of a polycrystalline granule is designated with a reference numeral 204a. The polycrystalline granule 204a has several crystalline structures 205 and may be produced by one of the above-described processes or another process all together. Referring to FIG. 1 for one example, the processor 10 may be used to produce the polycrystalline granule 204a, which in FIG. 1, is designated as the droplet 112.

At step 206 of FIG. 5, a nucleating agent is provided to coat the polycrystalline granule to produce a coated granule. The nucleating agent may be supplied from an external source and sprayed onto the polycrystalline granule.

Figure 6B:
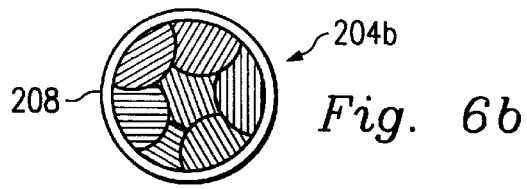

Referring also to FIG. 6b, an illustration of a coated granule is designated with a reference numeral 204b. A nucleating agent 208 in the form of a seeding powder is applied around the polycrystalline granule 204a to produce the coated granule 204b. For example, the seeding powder may be boron nitride or quartz. Other nucleating agents can be used, although materials that provide a good nucleating site and have minimal solubility in liquid silicon are desirable. Referring to FIG. 3 for example, the nucleating agent 208 can be applied in the entry tube 160.

At step 210 of FIG. 5, the coated granule passes through a heating zone until it is completely melted.

Figure 6C:
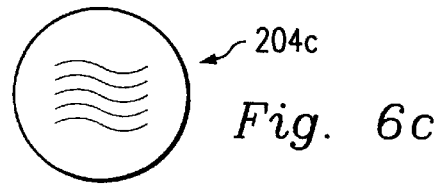

Referring also to FIG. 6c, an illustration of a completely melted granule is designated with a reference numeral 204c. For example, the melted granule 204c may pass through an ICP torch at a controlled rate, such as is described with respect to FIG. 3. The melted granule 204c is extremely pure from the non-contact processing. Non-contact processing techniques may also include levitating the coated granules 204b by an energy source such as electromagnetic induction, acoustic, electrostatic, aerodynamic, plasma or combination-type sources. In the case of electromagnetic and plasma levitation processes, the levitation energy may also be used for melting. Although not shown, the nucleating coat is still present around the outside of the melted granule 204c.

At step 212 of FIG. 5, the molten granule solidifies to form a course-grained granule with a relatively few number of polycrystals.

Figure 6D:
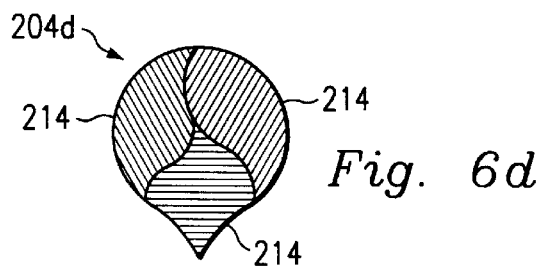

Referring also to FIG. 6d, an illustration of a solidified course-grained granule is designated with a reference numeral 204d. The granules 204d may solidify while dropping through a tube, such as the drop tube 42 described in FIG. 1. The temperature for solidification may be controlled by heaters surrounding the tube and an atmosphere of Ar, He or a mixture of both may be maintained in the tube. The course-grained granule 204d has a plurality of polycrystals 214, however, the number of polycrystals 214 is less than the number of polycrystals 205 of FIG. 6b. This is because the nucleating agent 208 seeds crystal growth in a limited number of directions as the granule 204d solidifies.

At step 216 of FIG. 5, the solidified course-grained granule is remelted. This time, however, the material is partially melted and a seed is left in-situ, or in place. The seed will be in-situ because it will "float" inside the molten material. Also, because the course-grained granule from step 212 consists of a relatively few number of polycrystals, it is likely that the seed will be single crystal, with a single growth direction. As in step 212 above, it is understood that any type of heating and melting may be used to remelt the material.

Figure 6E:
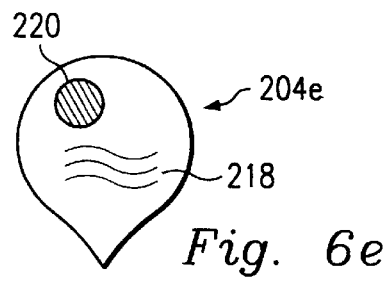

Referring also to FIG. 6e, an illustration of a partially-melted granule is designated with a reference numeral 204e. The granule 204e has a significant portion of molten material 218 and a small seed 220 floating therein. The melting process may be the same process used above with respect to FIG. 212, except instead of levitating the granule, it is allowed to drop through a drop tube, such as the drop tube 42 of FIG. 1. The temperature for solidification may be controlled by heaters, such as the heaters 46, and an atmosphere of Argon and/or Helium may be maintained in the tube 42.

At step 222 of FIG. 5, the partially-melted granule is cooled at a control rate. Because the granule includes a seed in-situ, crystalline patterns will be determined from the seed. If the seed is single crystal, as desired, the granule will cool into a larger, single crystal device.

Figure 6F:
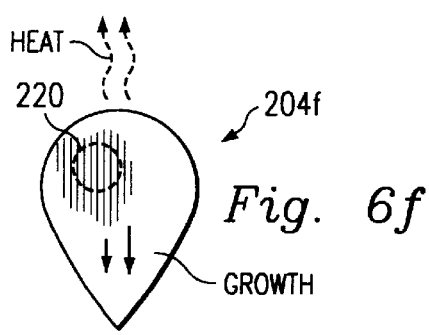

Referring also to FIG. 6f, an illustration of a single crystal semiconductor device is designated with a reference numeral 204f. The device 204f has a grain direction 224 that is consistent with the grain direction of the seed 220 (shown in phantom) from FIG. 6e. It is understood that the device 204f may not be entirely spherical in shape. For the sake of explanation, the device 204f is illustrated as having a "tear drop" shape. If the tear drop shape is unacceptable, various polishing techniques can be used to smooth the device 204f into a more perfect sphere.

As a result, the single crystal semiconductor device 204f is very pure, due to the non-contact processing and use of the in-situ seeding. Also, if for some reason, the seed produced in step 216 is polycrystal, the process 200 can be repeated, beginning at step 216.

Figure 7:
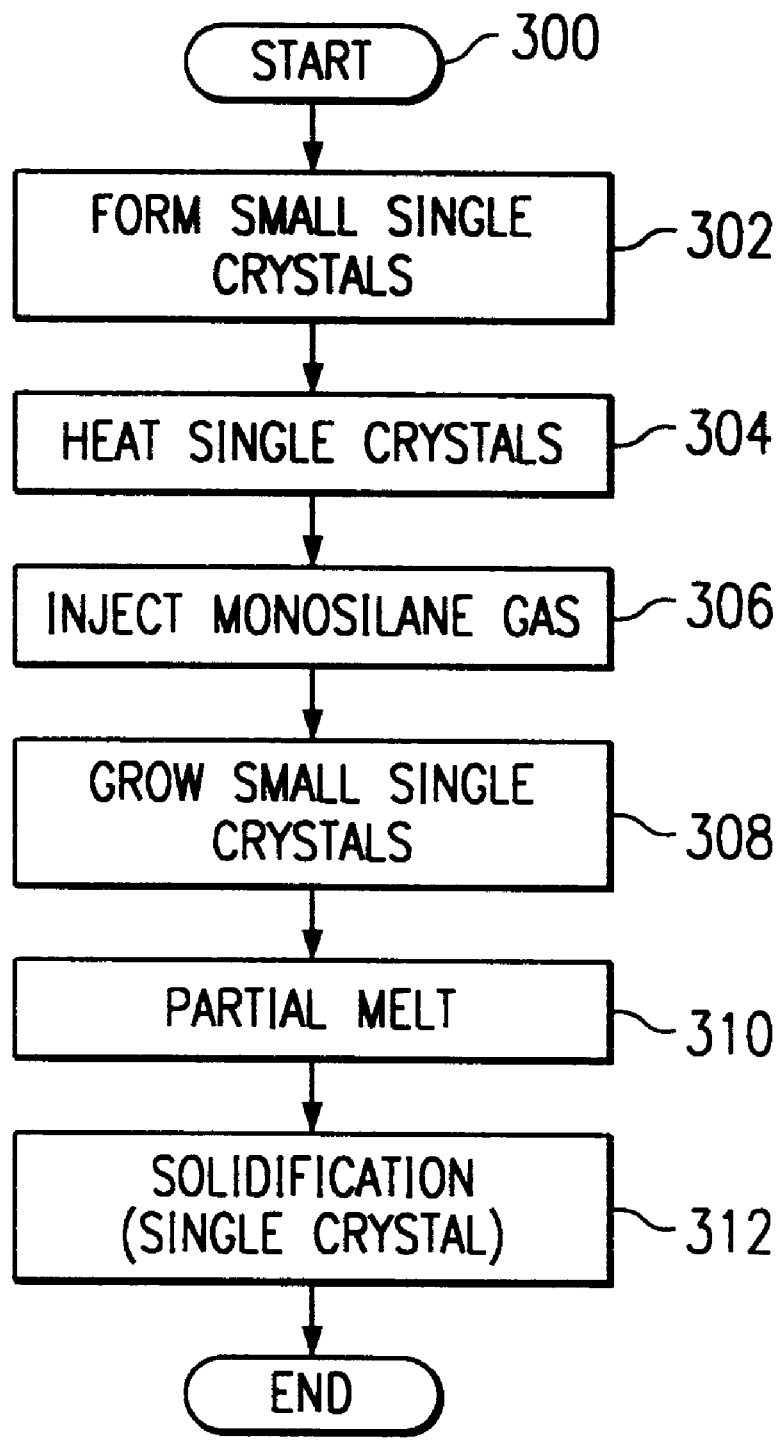
FIG. 7 is a flow chart of a method for facilitating the formation of single crystalline material.

Referring to FIG. 7, another method 300 may be used to facilitate the formation of single crystalline material with the above described devices and methods. The method 300 uses systems and methods described above as well as in co-pending U.S. patent application Ser. No. 08/858,004 filed on May 16, 1997, which is herein incorporated by reference.

At step 302, small single crystal particles are formed, such as by epitaxial growth using a method of presently incorporated U.S. patent application Ser. No. 08/858,004. At step 304, the single crystal particles are then fed into a fluidized bed reactor, which can be heated to a temperature that meets or exceeds the melting of Si. One example of a fluidized bed reactor is disclosed in the presently incorporated U.S. patent application Ser. No. 08/858,004. At step 306, a gas mixture, such as monosilane and Argon, is fed into the reactor. At step 308, when the monosilane gas reaches a critical temperature, it decomposes to silicon vapor and hydrogen. At step 310, the silicon vapor deposits on the single crystal particle and grows in size as a granule. If the temperature is high enough, epitaxial growth can occur and the resulting granule will be a single crystal. Otherwise, the resulting granule will be a polycrystal with a single crystal core.

At step 312, the granule is partially melted so that the outer polycrystalline layer is melted. This is similar to step 216 of FIG. 5. The unmelted single crystal core now acts as a seed for the rest of the molten silicon. Upon solidification, the partially molten granule converts to a single crystal. This is similar to step 222 of FIG. 5.

Several advantages result from the above-described embodiments. For one, the material seldom, if ever, comes in physical contact with any other device or any part of the processor 10. By melting the material without physical contact, less contaminants are introduced. Also, as the material drops or is levitated, it becomes spherical due to surface tension. Furthermore, single crystals can be formed through controlled melting and cooling of the material. Further still, many crystals can be processed in rapid succession, with the crucible 24 continually being refilled.

It is understood that several variations may be made in the foregoing. For example, different heating steps may be used in different parts of the processor. Further still, a catcher (not shown) may be included to receive the material and facilitate the heating or cooling process. The catcher may also be used to return the material to a furnace section for additional processing. Other modifications, changes and substitutions are also intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for forming spherical shaped semiconductor crystals, the apparatus comprising:
    a receiver tube for receiving semiconductor granules;
    a chamber for receiving the semiconductor granules from the receiver tube;
    a heater for heating the semiconductor granules inside the chamber into a molten mass;
    a nozzle located at one end of the chamber;
    a drop tube connected to the nozzle; and
    an inductively coupled plasma torch positioned adjacent to the drop tube,
    wherein droplets from the molten mass can be formed by the nozzle and dropped through the drop tube, thereby forming the spherical shaped semiconductor crystals.

2. The apparatus of claim 1 further comprising:
    an enclosure for maintaining an inert atmosphere, wherein the chamber is defined within the enclosure.

3. The apparatus of claim 1 further comprising:
    one or more heaters for heating an interior portion of the drop tube.

4. The apparatus of claim 3 wherein the crystals produced from the drop tube are coarse grained.

5. The apparatus of claim 1 wherein a portion of the inductively coupled plasma torch is positioned between the nozzle and the drop tube.

6. The apparatus of claim 1 wherein the inductively coupled plasma torch is housed in a quartz tube that is further connected to the drop tube.

7. A method for forming spherical shaped semiconductor crystals, the method comprising:
    receiving semiconductor granules into a chamber;
    heating the semiconductor granules inside the chamber into a molten mass;
    forming droplets of the molten mass using a nozzle located at one end of the chamber;
    moving the droplets through a tube connected to the nozzle; and
    providing an inductively coupled plasma torch adjacent to the tube,
    wherein the droplets become the spherical shaped semiconductor crystals as they move through the tube.

8. The method of claim 7 further comprising:
    maintaining an inert atmosphere for the chamber.

9. The method of claim 7 further comprising:
    heating an interior portion of the tube to slow a rate at which the droplets become the spherical shaped semiconductor crystals.

10. The method of claim 9 wherein the spherical shaped semiconductor crystals produced from the tube are coarse grained.

11. The method of claim 7 wherein a portion of the inductively coupled plasma torch is positioned between the nozzle and the tube so that the droplets are preheated by the portion.

12. The method of claim 7 wherein the inductively coupled plasma torch is housed in a quartz tube that is positioned between the nozzle and the tube.

13. A method of making a spherical shaped crystal, the method comprising the steps of:
    receiving a first polycrystal granule;
    melting the first polycrystal granule into a seed and a first molten mass; and
    solidifying the first molten mass using the seed, wherein the first molten mass creates crystalline directions identical to those of the seed and the solidifying occurs in a non-contact environment.

14. The method of claim 13 further comprising the steps of:
    receiving a second polycrystal granule, the second polycrystal having a relatively high number of crystalline directions;
    coating the second polycrystal granule with a nucleating agent;
    completely melting the coated second polycrystal granule into a second molten mass; and
    solidifying the second molten mass to form the first polycrystal granule.

15. The method of claim 14 wherein the first polycrystal granule has a relatively low number of crystalline directions.

16. The method of claim 14 wherein the step of completely melting the coated second polycrystal granule includes levitating the second polycrystal granule in a non-contact container.

17. The method of claim 13 wherein the seed and the spherical shaped crystal are both single crystals.

18. The method of claim 13 wherein the step of melting occurs without physical contact with the first polycrystal granule.

19. A system for making a spherical shaped single crystal, the system comprising:
    means for receiving a first polycrystal granule;
    means for melting the first polycrystal granule into a seed and a first molten mass; and
    a non-contact environment for solidifying the first molten mass using the seed, wherein the first molten mass creates crystalline directions identical to those of the seed.

20. The system of claim 19 further comprising:
    means for receiving a second polycrystal granule, the second polycrystal having a relatively high number of crystalline directions;

means for coating the second polycrystal granule with a nucleating agent;

means for melting the coated second polycrystal granule into a second molten mass; and means for solidifying the second molten mass to form the first polycrystal.

21. The system of claim 20 wherein the means for melting the coated second polycrystal granule and the means for melting the first polycrystal granule share a common structure.

22. The system of claim 20 wherein the first polycrystal granule has a relatively low number of crystalline directions.

23. The system of claim 20 wherein the means for melting the coated second polycrystal granule includes means for levitating the second polycrystal granule in a non-contact manner.

24. The system of claim 20 wherein the seed and the spherical shaped crystal are both single crystals.

25. The system of claim 19 wherein the means for melting never physically contacts the first polycrystal granule.

26. A method of making a spherical shaped silicon crystal, the method comprising the steps of:

forming a small single crystal particle;

applying a silicon vapor to the single crystal particle to form a silicon granule with a single crystal core;

melting the silicon granule into a seed and a first molten mass, the seed being formed from the single crystal core; and solidifying the first molten mass using the seed, wherein the first molten mass creates crystalline directions identical to those of the seed and the solidifying occurs in a non-contact environment.

27. The method of claim 26 wherein the small single crystal particle is formed using epitaxial growth.

28. The method of claim 26 wherein the step of applying a silicon vapor utilizes a fluid bed reactor.

29. The method of claim 26 wherein the spherical shaped crystal is a single crystal.

30. The method of claim 26 wherein the step of melting occurs without physical contact with the silicon granule.

31. The method of claim 26 further comprising:

heating the small single crystal particle before applying the silicon vapor.

* * * * *